United States Patent [19]
Kim et al.

[11] Patent Number: 5,866,466
[45] Date of Patent: Feb. 2, 1999

[54] METHODS OF FABRICATING TRENCH ISOLATION REGIONS WITH RISERS

[75] Inventors: Chang-gyu Kim; Jae-deok Kim, both of Kyungki-do, Rep. of Korea

[73] Assignee: Samsung Electronics Co., Ltd., Suwon, Rep. of Korea

[21] Appl. No.: 730,463

[22] Filed: Oct. 15, 1996

[30] Foreign Application Priority Data

Dec. 30, 1995 [KR] Rep. of Korea .................. 1995 69742

[51] Int. Cl.⁶ .................................................. H01L 21/76
[52] U.S. Cl. .......................... 438/426; 438/437; 438/692
[58] Field of Search .................................. 438/425, 427, 438/437, 692, 693, 227, 111

[56] References Cited

U.S. PATENT DOCUMENTS

| | | |
|---|---|---|
| 4,868,136 | 9/1989 | Ravaglia . |
| 5,004,703 | 4/1991 | Zdebel et al. . |
| 5,096,848 | 3/1992 | Kawamura . |
| 5,120,675 | 6/1992 | Pollack . |
| 5,308,784 | 5/1994 | Kim et al. . |
| 5,346,584 | 9/1994 | Nasr et al. . |
| 5,360,753 | 11/1994 | Park et al. . |
| 5,362,669 | 11/1994 | Boyd et al. . |
| 5,372,968 | 12/1994 | Lur et al. . |
| 5,385,861 | 1/1995 | Bashir et al. . |
| 5,453,639 | 9/1995 | Cronin et al. . |
| 5,466,628 | 11/1995 | Lee et al. . |
| 5,492,858 | 2/1996 | Bose et al. . |
| 5,494,857 | 2/1996 | Cooperman et al. . |
| 5,510,652 | 4/1996 | Burke et al. . |
| 5,539,240 | 7/1996 | Cronin et al. . |
| 5,567,645 | 10/1996 | Ahn et al. . |

FOREIGN PATENT DOCUMENTS 5-206263  8/1993  Japan .

OTHER PUBLICATIONS

Davari et al., "A New Planarization Technique, Using a Combination of RIE and Chemical Mechanical Polish (*CMP*)", IEDM 89, 1989, pp. 61–64.

*Primary Examiner*—George Fourson
*Attorney, Agent, or Firm*—Myers Bigel Sibley & Sajovec

[57] ABSTRACT

An isolation region is formed on a substrate by forming spaced apart mesas on the substrate, each mesa including a barrier region which caps the mesa. An insulation riser is then formed in the substrate, disposed between and separated from the spaced apart mesas. Spaced apart trenches are formed in the substrate on opposite sides of the insulation riser, each trench disposed between the insulation riser and a respective one of the mesas. An insulating material layer is formed on the substrate, the insulating material layer filling the spaced apart trenches and covering the insulation riser and the mesas, and then is chemical mechanical polished to expose the mesas and thereby form an isolation region spanning the spaced apart trenches. Preferably, barrier spacers are formed on sidewall portions of the mesas, and a surface portion of the substrate between the barrier regions is thermally oxidized using the barrier regions and the barrier spacers as an oxidation barrier to form the insulation riser. The isolation region includes an insulation riser at the surface of the substrate, extending from the surface into the substrate, and an insulation region on the substrate, covering the insulation riser and extending into the spaced apart trenches. The insulation region may include insulation spacers adjacent sidewall portions of the spaced apart trenches, and an insulation region on the substrate, covering the insulation riser and extending into the spaced apart trenches to contact the insulation spacers.

6 Claims, 8 Drawing Sheets

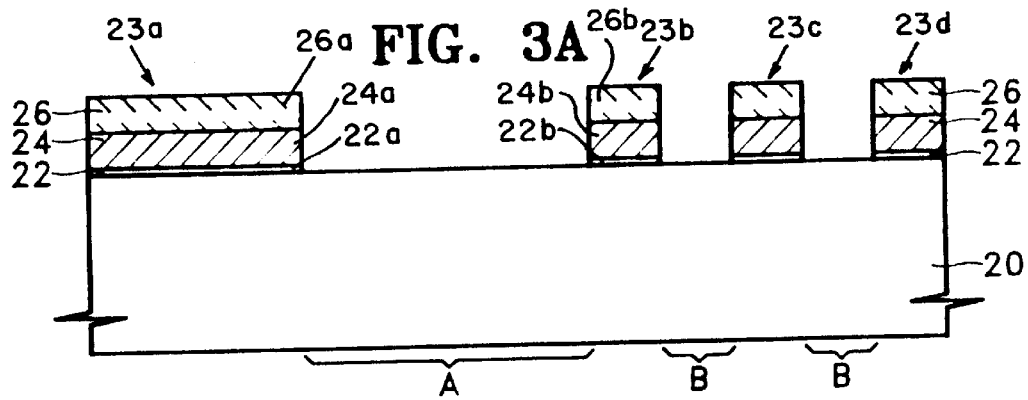
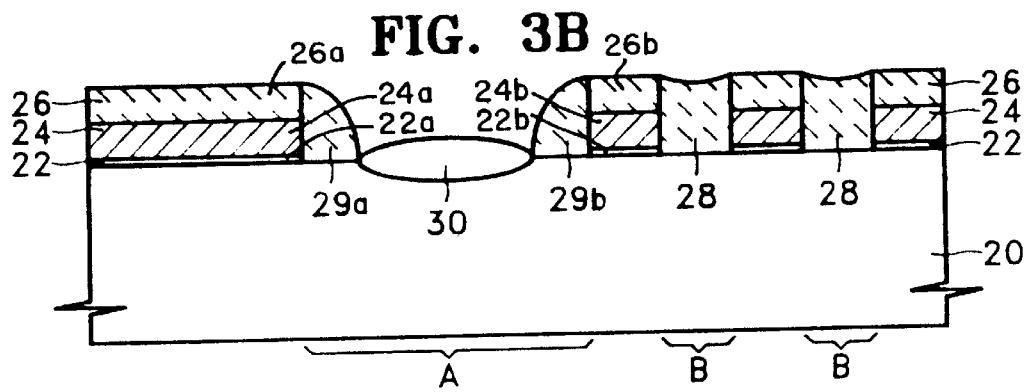
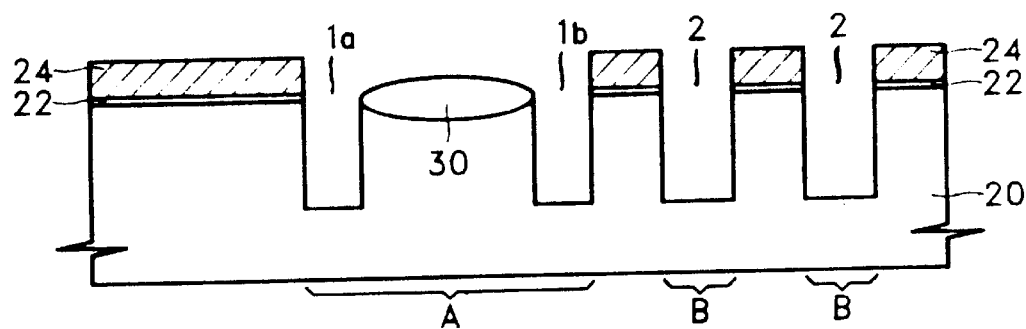
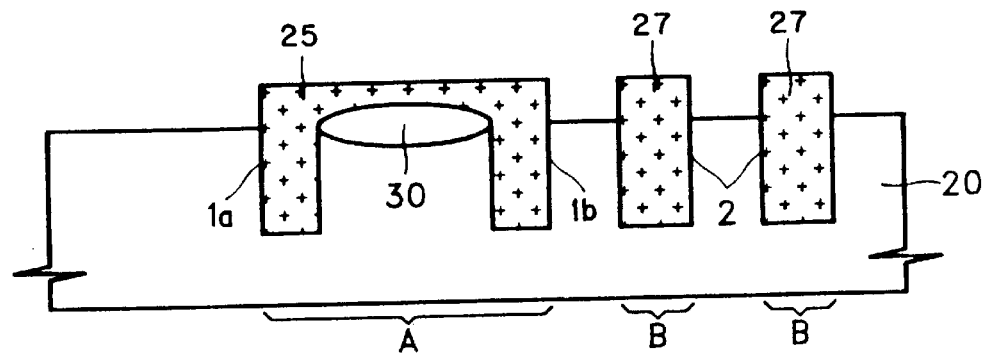

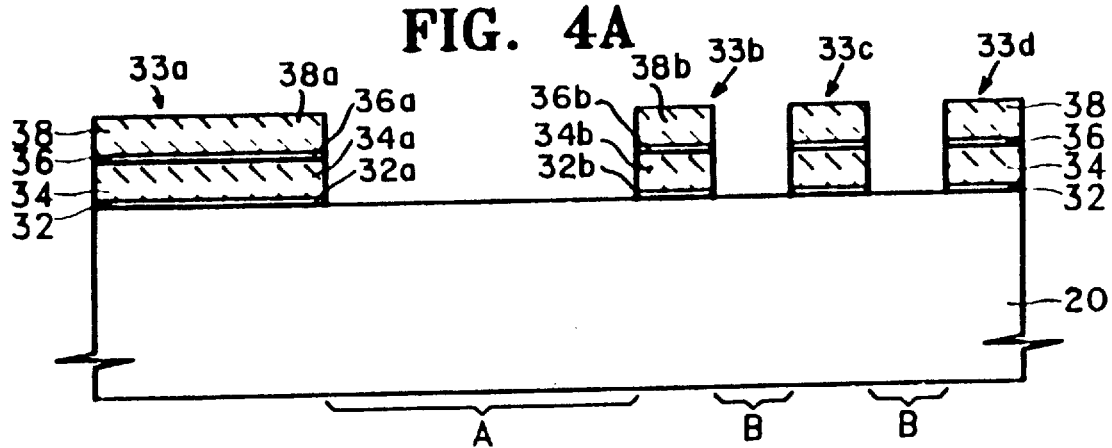
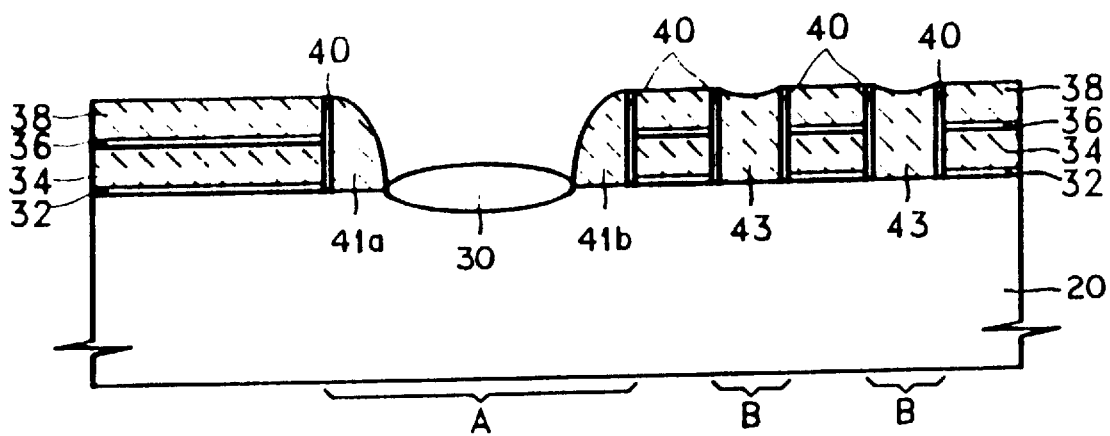
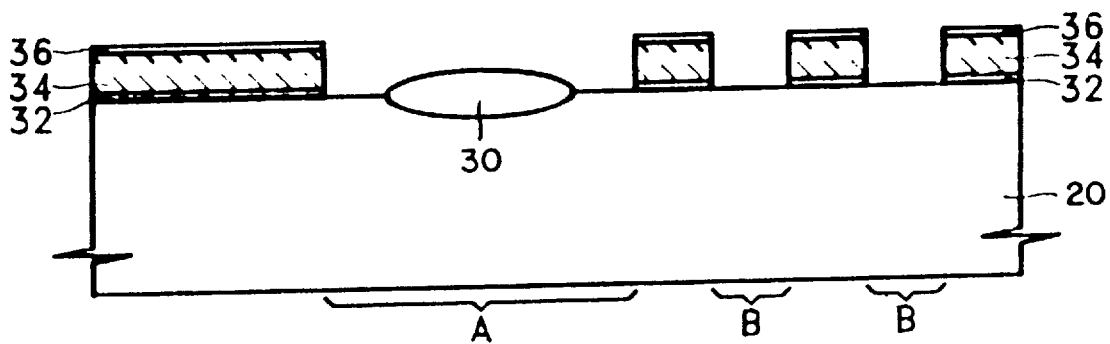

METHODS OF FABRICATING TRENCH ISOLATION REGIONS WITH RISERS

FIELD OF THE INVENTION

The present invention relates to integrated circuit devices and methods of fabrication therefor, in particular, to trench isolation regions and methods of fabrication therefor.

BACKGROUND OF THE INVENTION

As integrated circuit devices typically are built up on a substrate from successively applied and patterned layers, it generally is desirable to planarize underlying layers in order to obtain a satisfactory margin for photolithography for subsequently applied layers. Conventional planarization techniques include reflow techniques, etch-back techniques and chemical-mechanical polishing (CMP) techniques, i.e., combined etching and abrasive polishing techniques which typically use an abrasive etching slurry in conjunction with a polishing pad to remove material from a substrate surface. As is well-known to those skilled in the art, CMP may be particularly advantageous because it can achieve planarization at lower temperatures than etching or reflow techniques.

When utilizing CMP, it generally is important to minimize initial global step difference, i.e., spatial variation in the initial height of the material to be polished, in order to reduce pad deformation and improve the planarization achieved. As illustrated in FIGS. 1A–1C, wide and narrow trenches 3,4 may be formed in a substrate 10 by forming a silicon dioxide layer 12 and an etching protection layer 14 on the substrate 10, patterning the layers to form patterns 15, and using the patterns 15 as an etching mask to produce the wide and narrow trenches C,D. To form wide and narrow isolation regions 17,18, an insulating material layer 16 may be formed on the substrate 10 to fill the trenches C,D. The insulating material layer 16 may then be planarized to form the isolation regions 17,18.

Because of the step difference E generated in the insulating material layer 16 due to the wide trench 3, however, the wide isolation region 17 may deviate from planarity, a phenomenon referred to as "dishing." Moreover, because the trenches formed for a typical integrated circuit generally are nonuniformly distributed, a nonuniform distribution of the insulating material layer generally occurs across the surface of the substrate, which may increase global step difference and reduce the margin for CMP.

SUMMARY OF THE INVENTION

In light of the foregoing, it is an object of the present invention to provide isolation regions for semiconductor devices in a substrate and methods of fabrication therefor which exhibit reduced step difference in comparison with conventional devices and techniques.

It is another object of the present invention to provide isolation regions and methods of fabrication therefor which are less prone to dishing and provide for increased CMP margin.

These and other objects, features and advantages are provided according to the present invention by isolation regions formed by forming spaced apart mesas on a substrate, forming an insulation riser in the substrate between the mesas, preferably by thermal oxidation of the substrate's surface, forming trenches on opposite sides of the insulation riser, each disposed between the insulation riser and one of the mesas, forming an insulating material layer filling the spaced apart trenches and covering the insulation riser and the mesas, and chemical mechanical polishing the insulating material layer to expose the mesas.

In this manner, a wide isolation region may be formed which spans the two trenches. Because an insulation riser is formed between the trenches, the formation of a depression in the insulating material layer between the trenches may be avoided, *helping to prevent dishing in the surface of the isolation region. Moreover, controlling the step differences above wide trenches can help reduce global step difference across the substrate and maintain CMP process margin.

In particular, according to the present invention, an isolation region is formed on a substrate by forming spaced apart mesas on the substrate, each mesa including a barrier region which caps the mesa. An insulation riser is formed in the substrate, disposed between and separated from the spaced apart mesas. Spaced apart trenches are formed in the substrate on opposite sides of the insulation riser, each trench disposed between the insulation riser and a respective one of the mesas. An insulating material layer is formed on the substrate, the insulating material layer filling the spaced apart trenches and covering the insulation riser and the mesas, and chemical mechanical polished to expose the mesas and thereby form an isolation region spanning the spaced apart trenches. Preferably, barrier spacers are formed on sidewall portions of the mesas, defining a surface portion of the substrate therebetween, and the surface portion of the substrate between the barrier regions is thermally oxidized using the barrier regions and the barrier spacers as an oxidation barrier to thereby form the insulation riser.

According to a first method aspect, the spaced apart mesas are formed by forming a first masking layer on the substrate, forming a second masking layer on the first masking layer, forming a barrier layer on the masking layer, and removing portions of the barrier layer, the second masking layer and the first masking layer to expose a first surface portion of the substrate and form spaced apart mesas on opposite sides of the exposed first surface portion of the substrate. Each of the mesas includes a first masking region on the substrate, a second masking region on the first masking region, and a barrier region on the second masking region. The barrier spacers are formed by forming a second barrier layer covering the exposed first surface portion of the substrate, the insulation riser and the mesas, and anisotropically etching the second barrier layer to expose top portions of the mesas, to leave barrier spacers on sidewall portions of the mesas, and to expose a second surface portion of the substrate between the barrier spacers. The trenches are then formed by removing the barrier regions and the barrier spacers to thereby expose the second masking regions of the mesas and portions of the substrate between the insulation riser and a respective one of the mesas, and then etching portions of the substrate between the insulation riser and the mesas using the insulation riser and the mesas as a mask to thereby form spaced apart trenches in the substrate on opposite sides of the insulation riser. An insulation layer is then formed on the substrate, filling the trenches and covering the insulation riser and the mesas, and then is chemical mechanical polished to expose the masking regions of the mesas.

According to a second method aspect, the spaced apart mesas are formed by forming a first masking layer on the substrate, forming a first barrier layer on the first masking layer, forming a second masking layer on the first barrier layer, and forming a second barrier layer on the second masking layer. Portions of the second barrier layer, the second masking layer, the first barrier layer and the first masking layer are then removed to expose a first surface portion of the substrate and form spaced apart mesas on opposite sides of the exposed first surface portion of the substrate. Each of the mesas includes a first masking region on the substrate, a first barrier region on the first masking region, a second masking region on the first barrier region, and a second barrier region on the second masking region. A third masking layer is formed on the substrate covering sidewall portions of the mesas. A third barrier layer is formed on the substrate covering the exposed first surface portion of the substrate, the insulation riser and the mesas, and anisotropically etched to expose top portions of the mesas, to leave barrier spacers on sidewall portions of the mesas, and to expose a second surface portion of the substrate between the barrier spacers. The trenches are formed by removing the barrier spacers and the second barrier regions capping the mesas to thereby expose the second masking regions of the mesas and portions of the substrate disposed between the insulation riser and a respective one of the mesas, and etching portions of the substrate between the insulation riser and the mesas using the insulation riser and the mesas as a mask to thereby form spaced apart trenches in the substrate on opposite sides of the insulation riser. An insulation layer is then formed on the substrate, filling the trenches and covering the insulation riser and the mesas, and chemical mechanical polished to expose the first barrier regions of the mesas.

According to a third method aspect, the spaced apart mesas are formed by forming a first insulation layer on the substrate, forming a first barrier layer on the first masking layer, forming a second masking layer on the first barrier layer, forming a second barrier layer on the second masking layer, forming a third masking layer on the second barrier layer, and forming a third barrier layer on the third masking layer. Portions of the third barrier layer, the third masking layer, the second barrier layer, the second masking layer, the first barrier layer and the first masking layer are then removed to expose a first surface portion of the substrate and form spaced apart mesas on opposite sides of the exposed first surface portion of the substrate. Each of the mesas includes a first masking region on the substrate, a first barrier region on the first masking region, a second masking region on the first barrier region, a second barrier region on the second masking region, a third masking region on the second barrier region, and a third barrier region on the third masking region. The barrier spacers are formed by forming a fourth masking layer on the substrate covering sidewall portions of the mesas, forming a fourth barrier layer on the substrate covering the exposed first surface portion of the substrate, the insulation riser and the mesas, and anisotropically etching the fourth barrier layer to expose top portions of the mesas, to leave barrier spacers on sidewall portions of the mesas, and to expose a second surface portion of the substrate between the barrier spacers.

The trenches are formed by removing the barrier spacers and the third barrier regions capping the mesas to thereby expose the second masking regions of the mesas and portions of the substrate disposed between the insulation riser and a respective one of the mesas, and then etching portions of the substrate between the insulation riser and the mesas using the insulation riser and the mesas as a mask to thereby form spaced apart trenches in the substrate on opposite sides of the insulation riser. A first insulation layer is then formed on the substrate, filling the trenches and covering the insulation riser and the mesas, and anisotropically etched to expose the insulation riser and the second barrier regions of the mesas and to leave insulation spacers on sidewall portions of the trenches. The second barrier regions of the mesas are then removed to expose the second masking regions of the mesas, and a second insulation layer formed on the substrate, covering the insulation riser, the insulation spacers and the second masking regions of the mesas. The second insulation layer is then chemical mechanical polished to expose the first barrier regions of the mesas.

According to the present invention, an integrated circuit includes a substrate having spaced apart trenches therein, on opposite sides of a surface of the substrate, an insulation riser at the surface of the substrate, extending from the surface into the substrate, and an insulation region on the substrate, covering the insulation riser and extending into the spaced apart trenches, thereby defining an isolation region spanning the spaced apart trenches. Preferably, the substrate comprises silicon and the insulation riser and the insulation region each comprise silicon dioxide. The insulation region may include insulation spacers adjacent sidewall portions of the spaced apart trenches, and a capping insulation region on the substrate, covering the insulation riser and extending into the spaced apart trenches to cover the insulation spacers. Improved isolation regions are thereby provided.

BRIEF DESCRIPTION OF THE DRAWINGS

Some of the objects and advantages of the present invention having been stated, others will be more fully understood from the detailed description that follows and by reference to the accompanying drawings in which:

FIGS. 3A–3D are cross-sectional views of intermediate fabrication products illustrating steps for fabricating an isolation region according to a first method aspect of the present invention;

FIGS. 4A–4G are cross-sectional views of intermediate fabrication products illustrating steps for fabricating an isolation region according to a second method aspect of the present invention.

DETAILED DESCRIPTION OF PREFERRED EMBODIMENTS

Figure 1A:
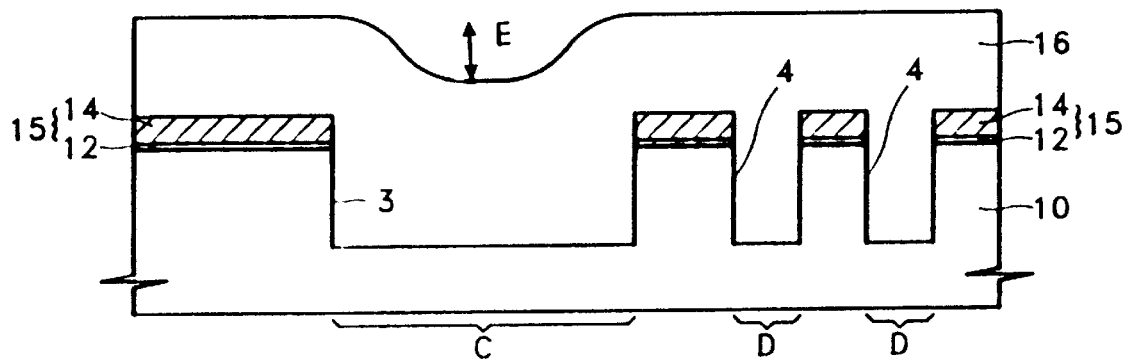
FIGS. 1A–1C are cross-sectional views illustrating techniques for fabricating isolation regions according to the prior art.
Figure 1B:
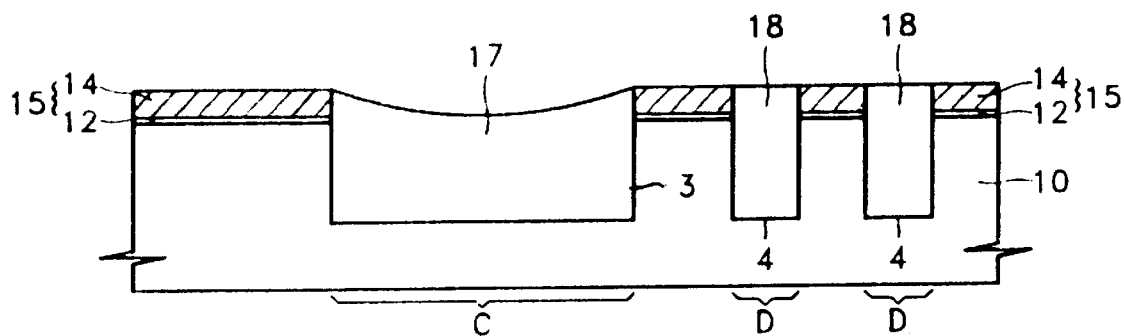
Figure 1C:
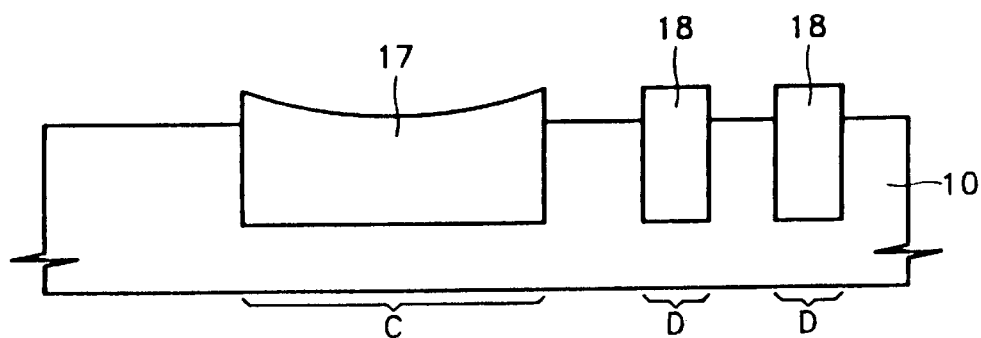

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 2:
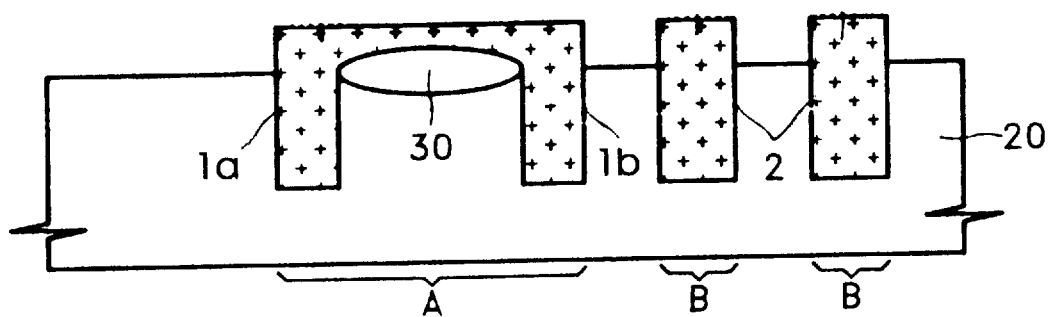
FIG. 2 is a cross-sectional view illustrating an isolation region according to the present invention.

A first embodiment of an integrated circuit according to the present invention is illustrated in FIG. 2. A substrate 20, preferably silicon, has spaced apart trenches 1a, 1b formed therein, on opposite sides of an insulation riser 30, preferably silicon dioxide, formed in the substrate 20. An insulation region 25 covers the insulation riser 30 and extends into the spaced apart trenches 1a, 1b, forming an isolation region A spanning the trenches 1a, 1b. Also illustrated are narrower isolation regions B, including insulation regions 27 formed in additional trenches 2 in the substrate 20.

FIGS. 3A–3D illustrate steps for forming the above-described embodiment according to a first method aspect of the present invention. As illustrated by FIG. 3A, a first masking layer 22, preferably silicon dioxide, is formed on the substrate 20. A second masking layer 24, preferably oxysilicon nitride, boron nitride, aluminum or tungsten, is formed on the first masking layer 22. A barrier layer 26, preferably silicon nitride, is then formed on the second masking layer 24.

The barrier layer 26 and the first and second masking layers 22,24 are then patterned to form spaced apart mesas 23a, 23b on the substrate 20. The spaced apart mesas 23a, 23b define a location for a for a wide isolation region A. Each mesa 23a, 23b includes a first masking region 22a, 22b on the substrate 20, a second masking region 24a, 24b on the first masking regions 22a, 22b, and a barrier region 26a, 26b, capping the mesa 23a, 23b. Preferably, the barrier layer 26 has an etching rate less than the etching rate of the second masking layer 24, to allow the barrier regions formed from the barrier layer to serve as etching barriers in subsequent etching steps. As also illustrated, additional mesas 23c, 23d may be formed to define locations for narrower isolation regions B.

As illustrated by FIG. 3B, to form barrier spacers 29a, 29b, a second barrier layer, preferably silicon nitride, is formed covering the mesas 23a, 23b and portions of the substrate 20 disposed between the mesas 23a, 23b. The second barrier layer is then anisotropically etched to expose a portion of the substrate between the mesas 23a, 23b and to leave barrier spacers 29a, 29b on sidewall portions of the mesas 23a, 23b. As illustrated, the second barrier layer may also fill between the additional mesas 23c, 23d, leaving barrier plugs 28 between the mesas. An insulation riser 30 is then formed in the portion of the substrate between the spaced apart mesas 23a, 23b, preferably by thermal oxidation.

As illustrated in FIG. 3C, the barrier spacers 29a, 29b and the barrier regions 26a, 26b capping the mesas 23a, 23b are then removed, and the portions of the substrate thereby exposed anisotropically etched using the insulation riser 30 and the mesas 23a, 23b as an etching mask. In this manner, spaced apart trenches 1a, 1b are formed on opposite sides of the insulation riser 30. Similarly, the barrier plugs 28 may be removed and the underlying portions of the substrate 20 etched to form additional trenches 2. Those skilled in the art will appreciate that for a typical integrated circuit, the additional trenches 2 for the narrow isolation regions B preferably are formed concurrently with the spaced apart trenches 1a, 1b used to form the wide isolation region A, but may also be formed independently using various techniques.

FIG. 3D illustrates steps for forming a wide isolation region A. An insulation layer is formed, filling the spaced apart trenches 1a, 1b, and covering the insulation riser 30 and the mesas 23a, 23b. Preferably, the insulation layer is silicon dioxide deposited by chemical vapor deposition (CVD). The insulation layer is then planarized by chemical mechanical polishing (CMP) to expose the second masking regions 24a, 24b of the mesas 23a, 23b and form insulation region 25. In this manner, the wide isolation region A is formed. Similarly, narrow isolation regions B may be formed by filling the additional trenches 2 with the insulation layer, chemical mechanical polishing to form the insulation regions 27. Subsequently, the second masking regions 24a, 24b and the first masking regions 22a, 22b may be removed. Due to the presence of the insulation riser 30, the step difference in the insulation layer can be reduced, thus helping improve the planarity of the insulation region 25 by minimizing dishing.

Figure 4D:
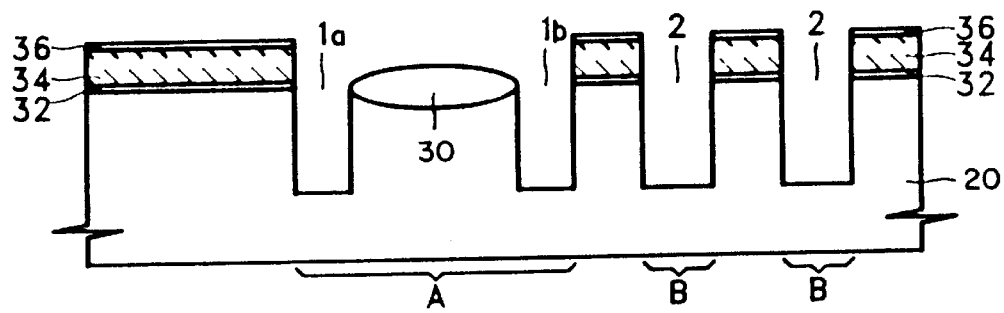

FIGS. 4A–4G illustrate steps for forming isolation regions according to a second method aspect of the invention. As illustrated by FIG. 4A, a first masking layer 32, preferably silicon dioxide, is formed on a substrate 20, and a first barrier layer 34, preferably silicon nitride, is then formed on the first masking layer 32. Similarly, a second masking layer 36, preferably silicon dioxide, and a second barrier layer 38, preferably silicon nitride, are formed on the first barrier layer 34. The first and second barrier layers 34, 38 and the first and second masking layers 36,32 are then patterned to form spaced apart mesas 33a, 33b on the substrate 20. The spaced apart mesas 33a, 33b define a location for a wide isolation region A. Each mesa 33a includes a first masking region 32a on the substrate 20, a first barrier region 34a on the first masking region 32a, a second masking region 36a on the first barrier region 34a, and a second barrier region 38a, capping the mesa 23a. Preferably, the second barrier layer 38 has an etching rate less than the etching rate of the second masking layer 36, to allow the barrier regions formed from the barrier layers to serve as etching barriers in subsequent etching steps. As also illustrated, additional mesas 33c, 33d may be formed to define locations for narrower isolation regions B.

As illustrated in FIG. 4B, a third masking layer 40 is formed, covering the mesas 33a, 33b. Then a third barrier layer, preferably silicon nitride, is formed, covering the mesas 33a, 33b and portions of the substrate 20 disposed between the mesas 33a, 33b. The third barrier layer is then anisotropically etched to expose a portion of the substrate 20 between the mesas 33a, 33b and to leave barrier spacers 41a, 41b on sidewall portions of the mesas 33a, 33b. As illustrated, the third barrier layer may also fill between the additional mesas 33c, 33d, with the etching leaving barrier plugs 43 between the mesas. An insulation riser 30 is then formed in the portion of the substrate between the spaced apart mesas 33a, 33b, preferably by thermal oxidation.

As illustrated in FIG. 4C, the barrier spacers 41a, 41b, the fourth oxidation layer 40 and the second barrier regions 38a, 38b capping the mesas 33a, 33b are then removed, and, as illustrated in FIG. 4D, exposed portions of the substrate are then anisotropically etched using the insulation riser 30 and the mesas 33a, 33b as an etching mask. Thus, spaced apart trenches 1a, 1b are formed on opposite sides of the insulation riser 30. Similarly the barrier plugs 43 may be removed and additional trenches 2 formed as described above in relation to the first method aspect.

Figure 4E:
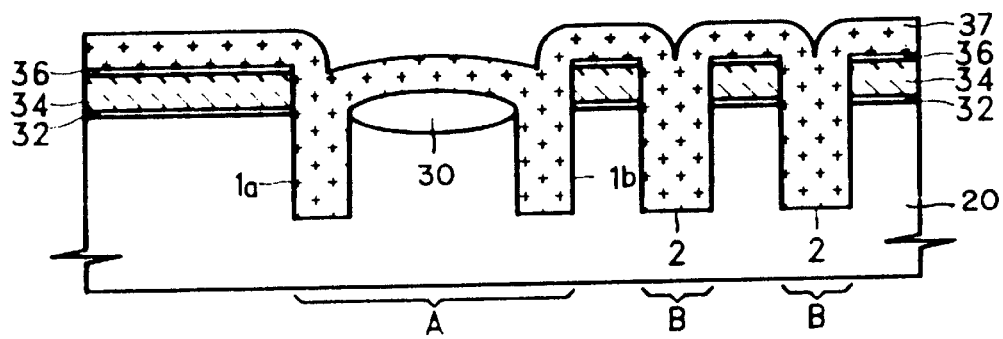
Figure 4F:
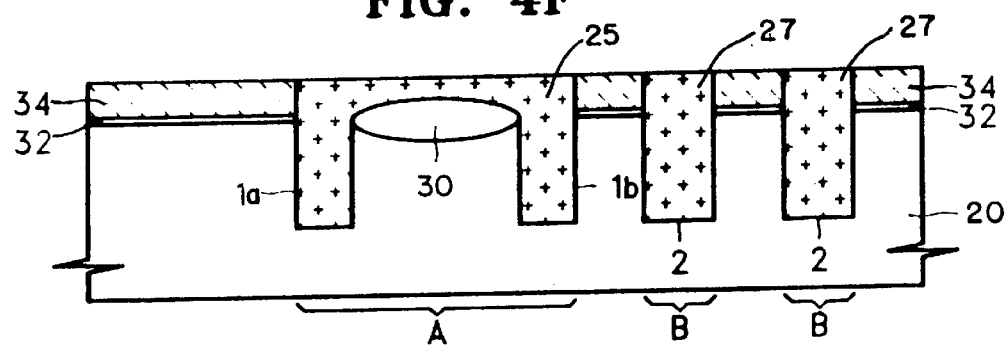
Figure 4G:
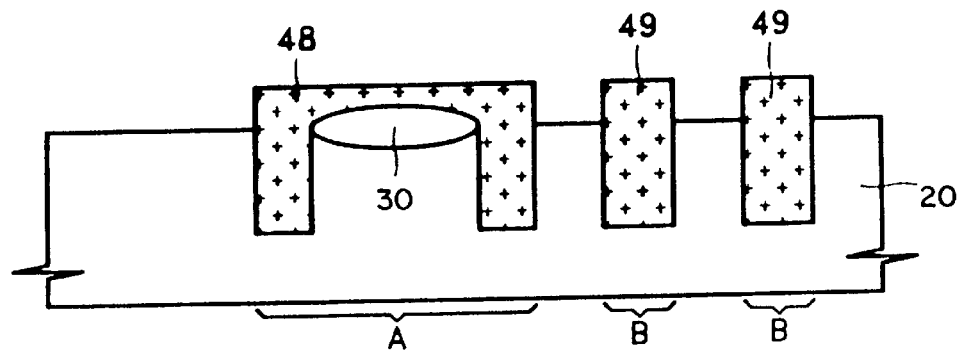

Referring to FIG. 4E, an insulation layer 37, preferably CVD silicon dioxide, is formed, covering the mesas 33a, 33b and the insulation riser 30 and filling the trenches 1a, 1b, 2. As shown in FIG. 4F, the insulation layer 46 is then planarized using CMP to expose the first barrier regions 34a, 34b of the mesas 33a, 33b and form insulation region 25, thus forming a wide isolation region A. Similarly, the insulation layer 37 may concurrently fill the additional trenches 2, and be used to form insulation regions 27 for narrow isolation regions B. Due to the presence of the insulation riser 30, the step difference in the insulation layer 37 can be reduced, thus helping improve the planarity of the insulation region 25 by minimizing dishing. Subsequently, as illustrated in FIG. 4G, the second masking regions 34a, 34b and the first masking regions 32a, 32b may be removed.

Figure 5A:
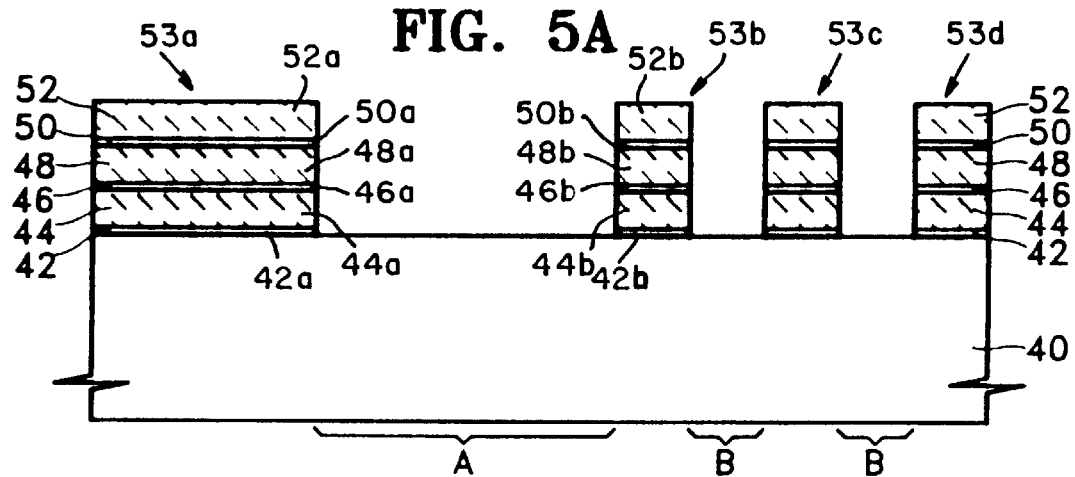
FIGS. 5A–5H are cross-sectional views of intermediate fabrication products illustrating steps for fabricating a second embodiment of an isolation region according to a third method aspect of the present invention.
Figure 5B:
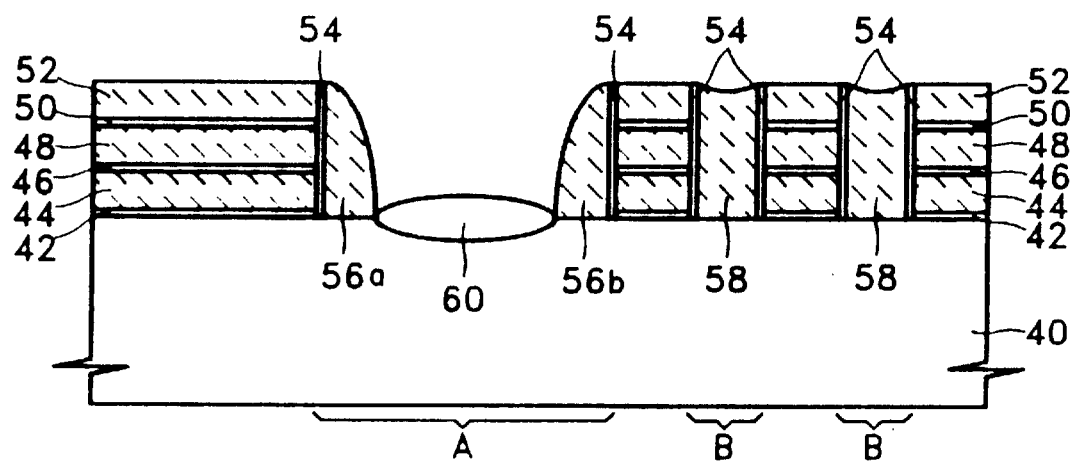

FIGS. 5A–5H illustrate steps for forming device isolation regions according to a third method aspect of the present invention. As illustrated by FIG. 5A, a first masking layer 42, preferably silicon dioxide, is formed on a substrate 40, and a first barrier layer 44, preferably silicon nitride, is then formed on the first masking layer 42. Similarly, a second masking layer 46, preferably silicon dioxide, and a second barrier layer 48, preferably silicon nitride, are formed on the first barrier layer 44. A third masking layer 50, preferably silicon dioxide, and a third barrier layer 52, preferably silicon nitride, are then formed on the second barrier layer 48. The first, second and third barrier layers 44, 48, 52 and the first, second and third masking layers 42, 46, 50 are then patterned to form spaced apart mesas 53a, 53b on the substrate 40. The spaced apart mesas 53a, 53b define a location for a wide isolation region A. Each mesa 53a includes a first masking region 42a on the substrate 40, a first barrier region 44a on the first masking region 42a, a second masking region 46a on the first barrier region 44a, a second barrier region 48a on the second masking layer 46a, a third masking layer 50a on the second barrier layer 48a, and a third barrier layer 52a, capping the mesa 53a. Preferably, the third barrier layer 52 has an etching rate less than the etching rate of the third masking layer 50, to allow the barrier regions formed from the barrier layers to serve as etching barriers in subsequent etching steps. As also illustrated, additional mesas 53c, 53d may be formed to define locations for narrower isolation regions B.

As illustrated in FIG. 4B, a fourth masking layer 54 is formed, covering the mesas 53a, 53b. Then a fourth barrier layer, preferably silicon nitride, is formed, covering the mesas 53a, 53b and portions of the substrate 40 disposed between the mesas 53a, 53b. The fourth barrier layer is then anisotropically etched to expose a portion of the substrate between the mesas 53a, 53b and to leave barrier spacers 56a, 56b on sidewall portions of the mesas 53a, 53b. As illustrated, the fourth barrier layer may also fill between the additional mesas 53c, 53d, with the etching leaving barrier plugs 58 between the mesas. An insulation riser 60 is then formed in the portion of the substrate between the spaced apart mesas 53a, 53b, preferably by thermal oxidation.

Figure 5C:
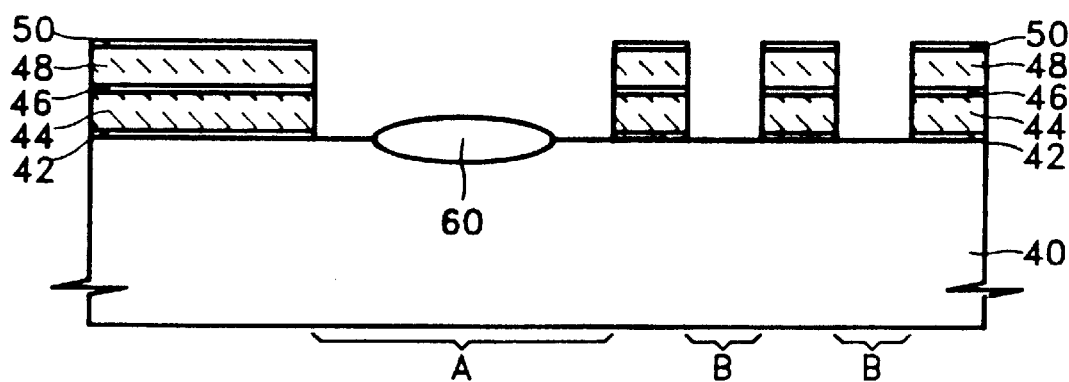
Figure 5D:
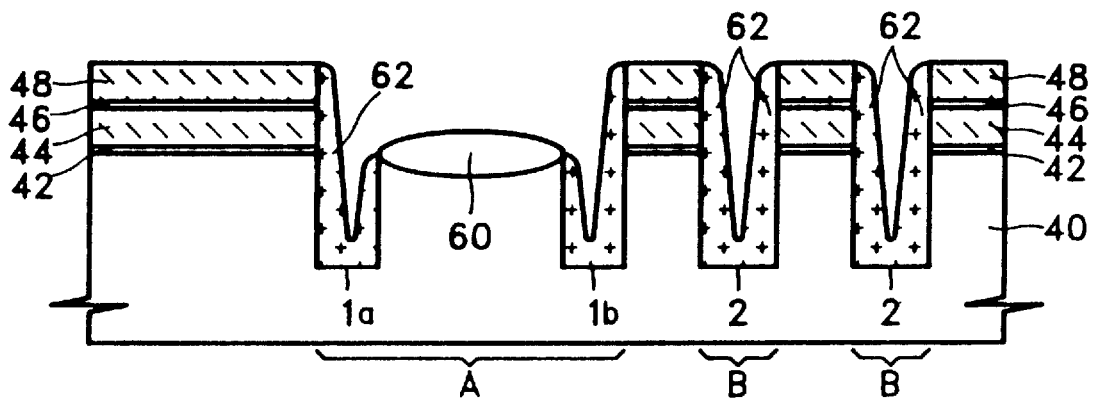
Figure 5E:
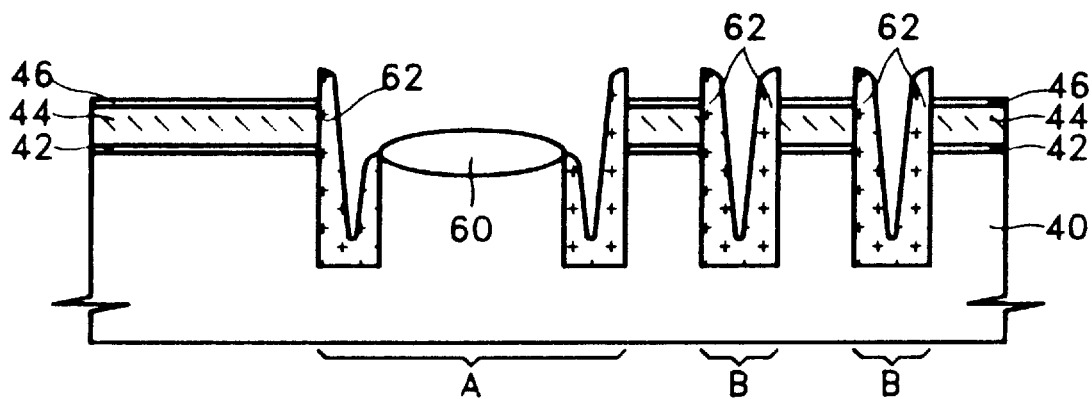

As illustrated in FIG. 5C, the barrier spacers 56a, 56b, the fourth masking layer 54 and the third barrier regions 52a, 52b capping the mesas 53a, 53b are then removed. As illustrated in FIG. 5D, the exposed portions of the substrate 40 are then anisotropically etched using the insulation riser 60 and the mesas 53a, 53b as an etching mask. Thus, spaced apart trenches 1a, 1b are formed on opposite sides of the insulation riser 60. Additional trenches 2 for narrow isolation regions B may also be formed, in a manner similar to those described above with respect to the first and second method aspects.

Still referring to FIG. 5D, a first insulation layer, preferably CVD silicon dioxide, is formed covering the mesas 53a, 53b and the insulation riser 60 and filling the spaced apart trenches 1a, 1b. The first insulation layer 46 is then anisotropically etched, removing the third masking regions 50a, 50b of the mesas 53a, 53b, and leaving insulation spacers 62 on sidewall portions of the trenches 1a, 1b. Similarly, insulation spacers 62 may be formed on sidewall portions of the additional trenches 2.

Figure 5F:
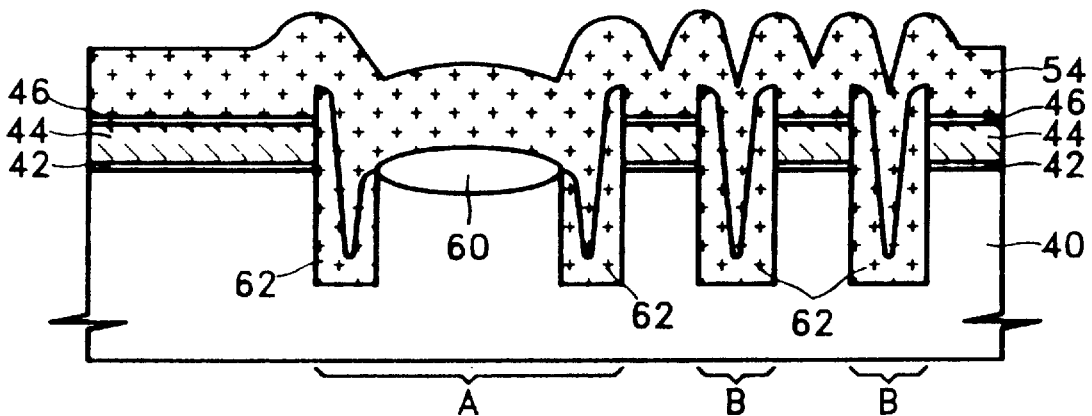
Figure 5G:
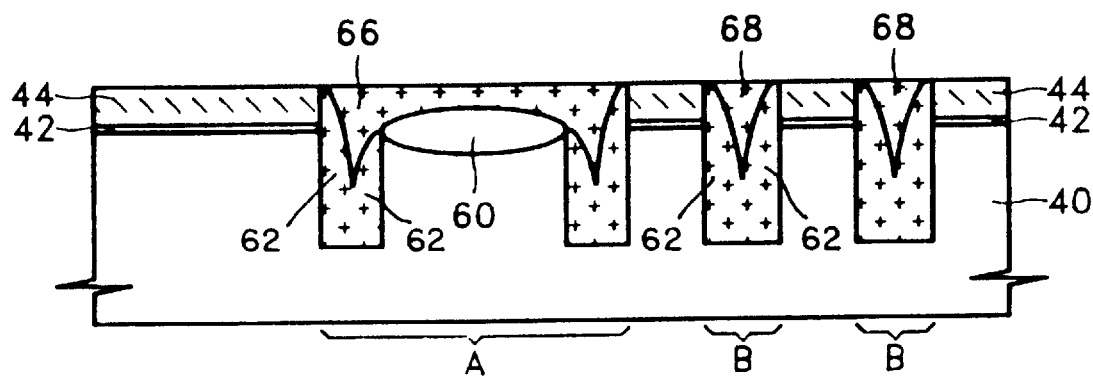

As illustrated in FIG. 5F, a second insulation layer 64 is then formed, filling the spaced apart trenches 1a, 1b and covering the insulation riser 60, the insulation spacers 62, and the mesas 53a, 53b. As shown in FIG. 5G, the second insulation layer 64 is then planarized by CMP to expose the first barrier region 44a, 44b of the mesas 53a, 53b, thus forming a wide isolation region A including insulation spacers 62 adjacent sidewall portions of the spaced apart trenches 1a, 1b, and a capping insulation region 66 on the insulation spacers 62, covering the insulation riser 60. Narrow isolation regions B may be similarly formed, including capping insulation regions 68 on insulation spacers 62 formed in additional trenches 2. Due to the presence of the insulation riser 60 and the insulation spacers 62, the step difference in the second insulation layer 64 can be reduced, thus helping improve the planarity of the capping insulation region 66 by minimizing dishing.

Figure 5H:
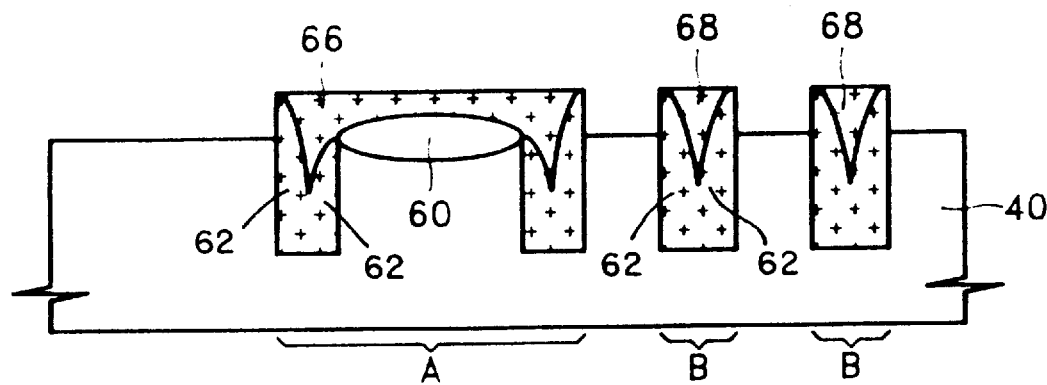

Subsequently, as illustrated in FIG. 5H, the first barrier regions 44a, 44b and the first masking regions 42a, 42b may be removed, forming a second embodiment according to the present invention, including a substrate 20, preferably silicon, with spaced apart trenches 1a, 1b on opposite sides of an insulation riser 60, preferably, silicon dioxide, formed in the substrate 40. Insulation spacers 62 lie adjacent sidewall portions of the trenches 1a, 1b, with a capping insulation region 66 being formed on the insulation spacers 62, spanning the trenches 1a, 1b, covering the insulation riser 60, and thus creating a wide isolation region A.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating an isolation region on a substrate, the method comprising the steps of:

forming spaced apart mesas on the substrate, each mesa including a barrier region which caps the mesa;

forming an insulation riser in the substrate, disposed between and separated from the spaced apart mesas;

forming spaced apart trenches in the substrate on opposite sides of the insulation riser, each trench disposed between the insulation riser and a respective one of the mesas;

forming an insulating material layer on the substrate, the insulating material layer filling the spaced apart trenches and covering the insulation riser and the mesas; and chemical mechanical polishing the insulating material layer to expose the mesas and thereby form an isolation region spanning the spaced apart trenches;

wherein said step of forming an insulation riser comprises the steps of:

forming barrier spacers on sidewall portions of the mesas, the barrier spacers defining a surface portion of the substrate therebetween; and thermally oxidizing the surface portion of the substrate between the mesas using the mesas and the barrier spacers as an oxidation barrier to thereby form an insulation riser in the substrate;

wherein said step of forming spaced apart mesas comprises the steps of:

forming a first masking layer on the substrate;

forming a first barrier layer on the first masking layer;

forming a second masking layer on the first barrier layer;

forming a second barrier layer on the second masking layer;

forming a third masking layer on the second barrier layer;

forming a third barrier layer on the third masking layer; and removing portions of the third barrier layer, the third masking layer, the second barrier layer, the second masking layer, the first barrier layer and the first masking layer to expose a first surface portion of the substrate and form spaced apart mesas on opposite sides of the exposed first surface portion of the substrate, each of the mesas including a first masking layer on the substrate, a first barrier layer on the first masking layer, a second masking layer on the first barrier layer, a second barrier layer on the second masking layer, a third masking layer on the second barrier layer, and a third barrier layer on the third masking layer.

2. A method according to claim 1 wherein said step of forming barrier spacers comprises the steps of:

forming a fourth masking layer on the substrate covering sidewall portions of the mesas;

forming a fourth barrier layer on the substrate covering the exposed first surface portion of the substrate, the insulation riser and the mesas; and anisotropically etching the fourth barrier layer to expose top portions of the mesas, to leave barrier spacers on sidewall portions of the mesas, and to expose a second surface portion of the substrate between the barrier spacers.

3. A method according to claim 2 wherein the first, second, third and fourth masking layers are silicon dioxide, and wherein the first, second, third and fourth barrier layers are silicon nitride.

4. A method according to claim 2 wherein said step of forming trenches comprises the steps of:

removing the barrier spacers and the third barrier layer capping the mesas to thereby expose the third masking layer of the mesas and portions of the substrate disposed between the insulation riser and the mesas; and etching the portions of the substrate between the insulation riser and the mesas using the insulation riser and the mesas as a mask to thereby form spaced apart trenches in the substrate on opposite sides of the insulation riser.

5. A method of fabricating an isolation region on a substrate, the method comprising the steps of:

forming spaced apart mesas on the substrate, each mesa including a barrier region which caps the mesa;

forming an insulation riser in the substrate, disposed between and separated from the spaced apart mesas;

forming spaced apart trenches in the substrate on opposite sides of the insulation riser, each trench disposed between the insulation riser and a respective one of the mesas;

forming an insulating material layer on the substrate, the insulating material layer filling the spaced apart trenches and covering the insulation riser and the mesas; and chemical mechanical polishing the insulating material layer to expose the mesas and thereby form an isolation region spanning the spaced apart trenches;

wherein said step of forming an insulation riser comprises the steps of:

forming barrier spacers on sidewall portions of the mesas, the barrier spacers defining a surface portion of the substrate therebetween; and thermally oxidizing the surface portion of the substrate between the mesas using the mesas and the barrier spacers as an oxidation barrier to thereby form an insulation riser in the substrate;

wherein said step of forming spaced apart mesas comprises the steps of:

forming a first masking layer on the substrate;

forming a first barrier layer on the first masking layer;

forming a second masking layer on the first barrier layer;

forming a second barrier layer on the second masking layer;

forming a third masking layer on the second barrier layer;

forming a third barrier layer on the third masking layer; and removing portions of the third barrier layer, the third masking layer, the second barrier layer, the second masking layer, the first barrier layer and the first masking layer to expose a first surface portion of the substrate and form spaced apart mesas on opposite sides of the exposed first surface portion of the substrate, each of the mesas including a first masking layer on the substrate, a first barrier layer on the first masking layer, a second masking layer on the first barrier layer, a second barrier layer on the second masking layer, a third masking layer on the second barrier layer, and a third barrier layer on the third masking layer;

wherein said step of forming an insulating material layer comprises the steps of:

forming a first insulation layer on the substrate, filling the trenches and covering the insulation riser and the mesas;

anisotropically etching the first insulation layer and the third masking layer of the mesas to expose the insulation riser and the second barrier layer of the mesas and to leave insulation spacers on sidewall portions of the trenches;

removing the second barrier layer of the mesas to expose the second masking layer of the mesas; and forming a second insulation layer on the substrate, covering the insulation riser, the insulation spacers and the second masking layer of the mesas.

6. A method according to claim 5 wherein the first and second insulation layers are silicon dioxide.

* * * * *